(12) United States Patent
Cho et al.

(10) Patent No.: US 7,719,045 B2
(45) Date of Patent: May 18, 2010

(54) CAPACITOR FOR A SEMICONDUCTOR DEVICE AND METHOD OF FORMING THE SAME

(75) Inventors: Young-Joo Cho, Gyeonggi-do (KR); Hyun-Seok Lim, Gyeonggi-do (KR); Rak-Hwan Kim, Gyeonggi-do (KR); Jung-Wook Kim, Gyeonggi-do (KR); Hyun-Suk Lee, Gyeonggi-do (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 23 days.

(21) Appl. No.: 12/251,352

(22) Filed: Oct. 14, 2008

(65) Prior Publication Data

US 2009/0039404 A1   Feb. 12, 2009

Related U.S. Application Data

(62) Division of application No. 11/286,316, filed on Nov. 23, 2005, now Pat. No. 7,452,783.

(30) Foreign Application Priority Data

Nov. 25, 2004 (KR) .......................... 2004-0097363

(51) Int. Cl.
*H01L 27/108* (2006.01)
(52) U.S. Cl. .............. 257/309; 257/E27.048; 257/E29.343
(58) Field of Classification Search .......... 257/309, 257/532, E21.651, E27.048, E29.343; 438/239, 438/253, 396
See application file for complete search history.

(56) References Cited

U.S. PATENT DOCUMENTS

| | | | |
|---|---|---|---|
| 5,420,072 A | 5/1995 | Fiordalice et al. | |
| 6,146,991 A | 11/2000 | Cheng et al. | |
| 6,294,425 B1 | 9/2001 | Hideki | |
| 6,573,552 B1 | 6/2003 | Thakur | |
| 6,630,387 B2 | 10/2003 | Horii | |
| 6,632,721 B1 | 10/2003 | Iijima et al. | |
| 6,790,725 B2 | 9/2004 | Coursey | |

(Continued)

FOREIGN PATENT DOCUMENTS

JP   2001-177072   6/2001

(Continued)

*Primary Examiner*—Quoc D Hoang
(74) *Attorney, Agent, or Firm*—Harness, Dickey & Pierce, P.L.C.

(57) ABSTRACT

In a capacitor having a high dielectric constant, the capacitor includes a cylindrical lower electrode, a dielectric layer and an upper electrode. A metal oxide layer is formed on inner, top and outer surfaces of the lower electrode as the dielectric layer. A first sub-electrode is formed on a surface of the dielectric layer along the profile of the lower electrode and a second sub-electrode is continuously formed on the first sub-electrode corresponding to the top surface of the lower electrode, so an opening portion of the lower electrode is covered with the second sub-electrode. The first and second sub-electrodes include first and second metal nitride layers in which first and second stresses are applied, respectively. Directions of the first and second stresses are opposite to each other. Accordingly, cracking is minimized in the upper electrode with the high dielectric constant, thereby reducing current leakage.

8 Claims, 13 Drawing Sheets

U.S. PATENT DOCUMENTS

| | | |
|---|---|---|
| 6,794,245 B2 | 9/2004 | Zheng |
| 7,087,482 B2 * | 8/2006 | Yeo et al. .................... 438/240 |
| 2004/0130849 A1 | 7/2004 | Kurihara et al. |
| 2005/0093049 A1 | 5/2005 | Kundalgurki et al. |
| 2006/0151852 A1 | 7/2006 | Senzaki |

FOREIGN PATENT DOCUMENTS

| | | |
|---|---|---|
| KR | 2002-0092465 | 12/2002 |
| KR | 2003-0002789 | 1/2003 |
| KR | 2004-0002222 | 1/2004 |
| WO | 84/02128 | 6/1984 |

* cited by examiner

US 7,719,045 B2

CAPACITOR FOR A SEMICONDUCTOR DEVICE AND METHOD OF FORMING THE SAME

CROSS-REFERENCE TO RELATED APPLICATIONS

This is a Divisional of U.S. patent application Ser. No. 11/286,316, filed on Nov. 23, 2005, now pending, which claims priority from Korean Patent Application No. 10-2004-0097363, filed on Nov. 25, 2004, the contents of which are herein incorporated by reference in their entirety.

BACKGROUND

1. Technical Field

This disclosure relates to a capacitor and a method of forming the same, and more particularly, to a capacitor having a dielectric layer that includes a material of high dielectric constant and a method of forming the same.

2. Description of the Related Art

As the memory cell area of a semiconductor device decreases, the capacitance of a capacitor in the cell decreases as well. A decreased data storage capacity of the memory cell results from the reduced capacitance. Accordingly, a refresh characteristic of the memory cell deteriorates and may require a high operation voltage.

For the above reasons, ways of improving the capacitance of a memory cell without decreasing a surface of the cell area of the semiconductor device have been explored. For example, increasing the effective surface area of the capacitor and/or the dielectric constant of the dielectric layer has been suggested as ways to improve the capacitance of the capacitor.

To increase the effective surface of a capacitor, a dielectric layer of a capacitor is formed as a thin layer because the cell area of a memory device is limited and defined, or a lower electrode of a capacitor may be formed as a vertical structure, for example, in a cylindrical shape. However, the thin dielectric layer may cause an increased current leakage from the capacitor, and the vertical structure of the lower electrode increases the manufacturing costs and reduces manufacturing efficiency due to various additional complicated processes that are required to produce the vertical structure.

Recently, dielectric layers of a capacitor have included a material having a dielectric constant (k) that is greater than that of silicon oxide (hereinafter referred to as a high-k material) in order to overcome the problems associated with increasing the effective surface of a capacitor. Examples of high-k materials include metal oxides such as aluminum oxide ($Al_2O_3$), tantalum oxide ($Ta_2O_5$), and hafnium oxide ($HfO_2$).

The use of metal oxides as high-k materials is problematic because gases around the metal oxide easily react with the metal oxide when a heat budget is applied in a subsequent process, which rapidly decreases the dielectric constant. For this reason, a polysilicon layer that is used as an upper electrode of the capacitor cannot be formed directly on the metal oxide layer because the polysilicon layer is typically formed at a temperature greater than about 700° C.

To reduce this problem, a titanium nitride layer is typically formed on the metal oxide layer before the polysilicon layer is formed, thereby preventing a chemical reaction between the polysilicon layer and the underlying metal oxide layer. However, the process of forming the titanium nitride layer on the metal oxide layer may cause additional problems.

For example, when a titanium nitride layer is formed on a dielectric layer composed of a high-k material such as hafnium oxide, gases such as titanium chloride ($TiCl_4$) gas and ammonia ($NH_3$) gas are generally used as the processing gases. A diffusion rate for the titanium chloride gas is greater than that of the ammonia gas, so the titanium chloride gas remains on a bottom portion of a cylindrical capacitor. The titanium chloride gas reacts with the hafnium oxide at the bottom portion of the cylindrical capacitor, thereby producing hafnium chloride ($HfCl_4$) on the bottom portion of the capacitor. The boiling point of the hafnium chloride is very low and it easily evaporates during the formation process for the capacitor, so a thickness of the hafnium oxide layer will be locally reduced. A thin dielectric layer causes a discharge of electrons stored in the capacitor, so that data stored in a cell is unfortunately erased.

Furthermore, the surface of the titanium nitride layer has a tendency to form cracks because the internal stress of the titanium nitride layer is very high due to deposition characteristics. In particular, when a lower electrode is formed as a hemispherical grained layer or a mesh-shaped supporting pattern, the cracking is more easily generated on the titanium nitride layer because the lower electrode has a wavy surface. Decreasing a thickness of the titanium nitride layer may prevent the generation of the cracking. However, when the thickness of the titanium nitride layer is too small, for example, below about 100 Å, the titanium nitride layer no longer functions as an effective barrier metal layer. The cracking of the titanium nitride layer causes current leakage, thereby degrading the operational characteristics of the capacitor.

Embodiments of the invention address these and other disadvantages of the conventional art.

SUMMARY

Embodiments of the invention include a capacitor capable of improving the operational characteristics of a semiconductor device as well as a method of forming the capacitor.

BRIEF DESCRIPTION OF THE DRAWINGS

The above and other features and advantages of the invention will become readily apparent by reference to the following detailed description when considered in conjunction with the accompanying drawings.

DETAILED DESCRIPTION

Figure 1:
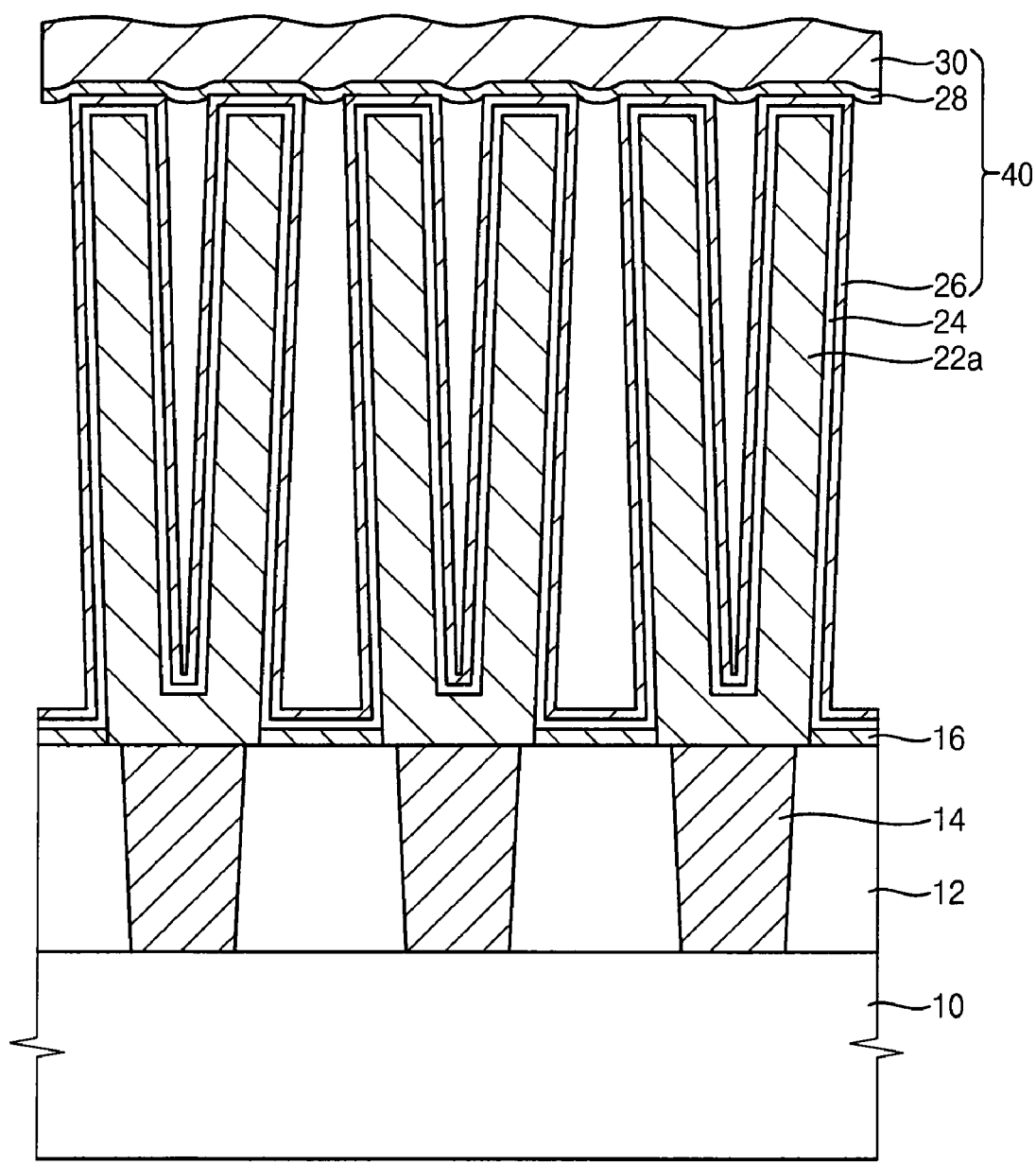
FIG. 1 is a sectional diagram illustrating a capacitor for a semiconductor device according to some embodiments of the invention.

The invention is described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. In the drawings, the sizes and relative sizes of layers and regions may be exaggerated for clarity.

In the following written description, when an element or layer is referred to as being "on," "connected to" or "coupled to" another element or layer, the element or layer may be directly on, directly connected, or directly coupled to the other element or layer or intervening elements or layers may be present. In contrast, when an element is referred to as being "directly on," "directly connected to" or "directly coupled to" another element or layer, there are no intervening elements or layers present. Like numbers refer to like elements throughout. As used herein, the term "and/or" includes any and all combinations of one or more of the associated listed items.

It will be understood that, although the terms first, second, third, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Spatially relative terms, such as "beneath," "below," "lower," "above," "upper" and the like, may be used herein for ease of description to describe the relationship of one element or feature to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of the invention. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Embodiments of the invention are described herein with reference to cross-section illustrations that are schematic illustrations of idealized embodiments (and intermediate structures) of the invention. As such, variations from the shapes of the illustrations as a result, for example, of manufacturing techniques and/or tolerances, are to be expected. Thus, embodiments of the invention should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the invention.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and should not be interpreted in an idealized or overly formal sense unless expressly so defined herein.

FIG. 1 is a sectional diagram illustrating a capacitor for a semiconductor device according to some embodiments of the invention.

Referring to FIG. 1, an insulation interlayer 12 is formed on a substrate 10, and a contact plug 14 is formed through the insulation interlayer 12. A cylindrical lower electrode 22a for the capacitor makes contact with a top surface of the contact plug 14. In the present embodiment, the lower electrode 22a comprises polysilicon or a metal nitride. Examples of the metal nitride include titanium/titanium nitride, tantalum/tantalum nitride, etc.

A dielectric layer 24 comprising a metal oxide of a high dielectric constant is formed on inner, top and outer surfaces of the cylindrical lower electrode 22a, so that the dielectric layer is formed along a profile of the lower electrode 22a. Examples of the dielectric layer 24 include an aluminum oxide layer, a hafnium oxide layer, and a multi-layer of an aluminum oxide layer and a hafnium oxide layer alternately stacked on each other.

An upper electrode 40 including first, second and third sub-electrodes 26, 28 and 30 is formed on the dielectric layer 24.

In particular, the first sub-electrode 26 including a first titanium nitride layer is formed on a surface of the dielectric layer 24 along the profile of the lower electrode 22a, and a tensile stress is applied in the first sub-electrode 26. For example, the first sub-electrode 26 may be formed by a cyclic chemical vapor deposition (CVD) process, a CVD process, or an atomic layer deposition (ALD) process. An example of the cyclic CVD process includes a sequential flow deposition (SFD) process in which the processing gases are sequentially supplied into a chamber, and an example of the CVD process includes a metal organic CVD (MOCVD). In the present embodiment, the first titanium nitride layer is formed by the SFD process, so that the first sub-electrode 26 has good step coverage and a small thickness, below about 200 Å. The first sub-electrode 26 is formed to such a small thickness to prevent cracking therein, and is preferably formed to a thickness of about 50 Å to about 110 Å.

The second sub-electrode 28 is continuously formed on a surface of the first sub-electrode 26 corresponding to the top surface of the lower electrode, so that an opening portion of the cylindrical lower electrode 22a is covered with the second sub-electrode 28. The second sub-electrode 28 includes a second titanium nitride layer, and a compression stress is applied in the second sub-electrode 28. Accordingly, the tensile stress in the first sub-electrode 26 and the compression stress in the second sub-electrode 28 cancel each other in the upper electrode 40. In the illustrated embodiments, the second sub-electrode 28 is formed by a physical vapor deposition (PVD) process.

The third sub-electrode 30 comprising polysilicon is formed on the second sub-electrode 28. In the illustrated embodiments, the third sub-electrode 30 is formed to a thickness greater than the second sub-electrode 28, so that an overall electric resistance decreases.

In the above structure of the capacitor, the second sub-electrode 28 covers the opening portion of the cylindrical lower electrode 22a, and the third sub-electrode 30 of polysilicon does not make contact with the dielectric layer 24 on the surface of the cylindrical lower electrode 22a. As a result, when the third sub-electrode 30 of polysilicon is formed at a high temperature, a chemical reaction between the polysilicon and the dielectric layer 24 is minimized and the dielectric constant of the dielectric layer 24 does not decrease.

Furthermore, the tensile stress in the first sub-electrode 26 and the compression stress in the second sub-electrode 28 are applied in opposite directions, so an internal stress is remarkably lessened in the upper electrode 40 due to cancellation of the opposite directional stresses. Furthermore, although the first sub-electrode 26 is formed to such a small thickness to prevent cracking therein, an overall electrical resistance of the upper electrode 40 is still maintained to be very low because the second sub-electrode 28 is formed on the first sub-electrode 26. Accordingly, cracking is minimized in the first and second sub-electrodes 26 and 28.

FIGS. 2 to 6 are sectional diagrams illustrating a method of forming the capacitor of FIG. 1 in accordance with some embodiments of the invention.

Figure 2:
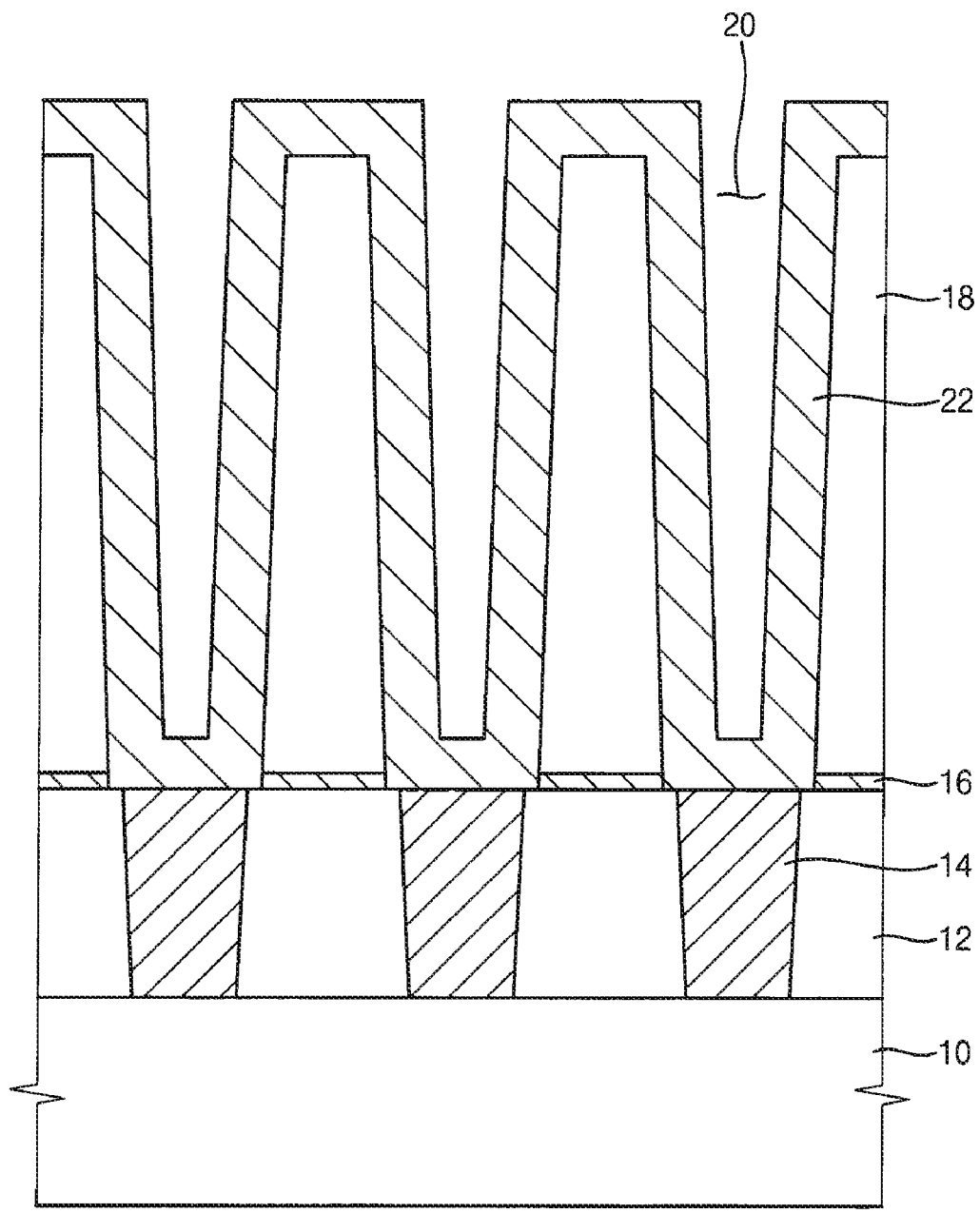
FIGS. 2 to 6 are sectional diagrams illustrating a method of forming the capacitor of FIG. 1 in accordance with some embodiments of the invention.

Referring to FIG. 2, a device isolation layer (not shown) for separating conductive structures on a substrate 10 is formed on the substrate 10, so that an active region on which the conductive structures are formed and a field region on which the device isolation layer is formed are defined on the substrate 10. Then, underlying structures (not shown), such as a transistor and a bit line, are formed on the substrate 10.

An insulation interlayer 12 is formed on the substrate 10 including the underlying structures and a contact plug 14 is formed through the insulation interlayer 12. In the illustrated embodiments, the contact plug 14 makes contact with a landing pad (not shown) for a lower electrode that is connected to source/drain regions of a transistor.

An etching stop layer 16 is formed on the insulation interlayer 12. The etching stop layer 16 may comprise a silicon nitride. A mold oxide layer 18 for molding a lower electrode of the capacitor for a semiconductor device is formed on the etching stop layer 16. The mold oxide layer 18 may comprise a silicon oxide. The mold oxide layer 18 may be a single layer or a multi-layer that includes various layers having different etching rates. The mold oxide layer 18 may include a borophosphosilicate glass (BPSG) layer, a tetraethylorthosilicate (TEOS) layer, etc.

Next, the mold oxide layer 18 and the etching stop layer 16 are sequentially and partially etched away, thereby forming cylindrical holes (not shown) through which the top surface of the contact plug 14 is exposed.

A thin layer having good step coverage, such as a polysilicon layer and a metal layer, is formed on an inner surface of the cylindrical hole, the exposed top surface of the contact plug 14, and a top surface of the mold oxide layer 18, thereby forming a cylindrical lower electrode 22. A first hole 20 is formed at a center of the cylindrical lower electrode 22, and a width of the first hole 20 is smaller than that of the cylindrical hole. The metal layer may include a single layer comprising titanium or titanium nitride or a multi-layer including a titanium layer and a titanium nitride layer that are alternately stacked on each other. The metal layer may be formed by a CVD process, a cyclic CVD process, or an ALD process.

Figure 3:
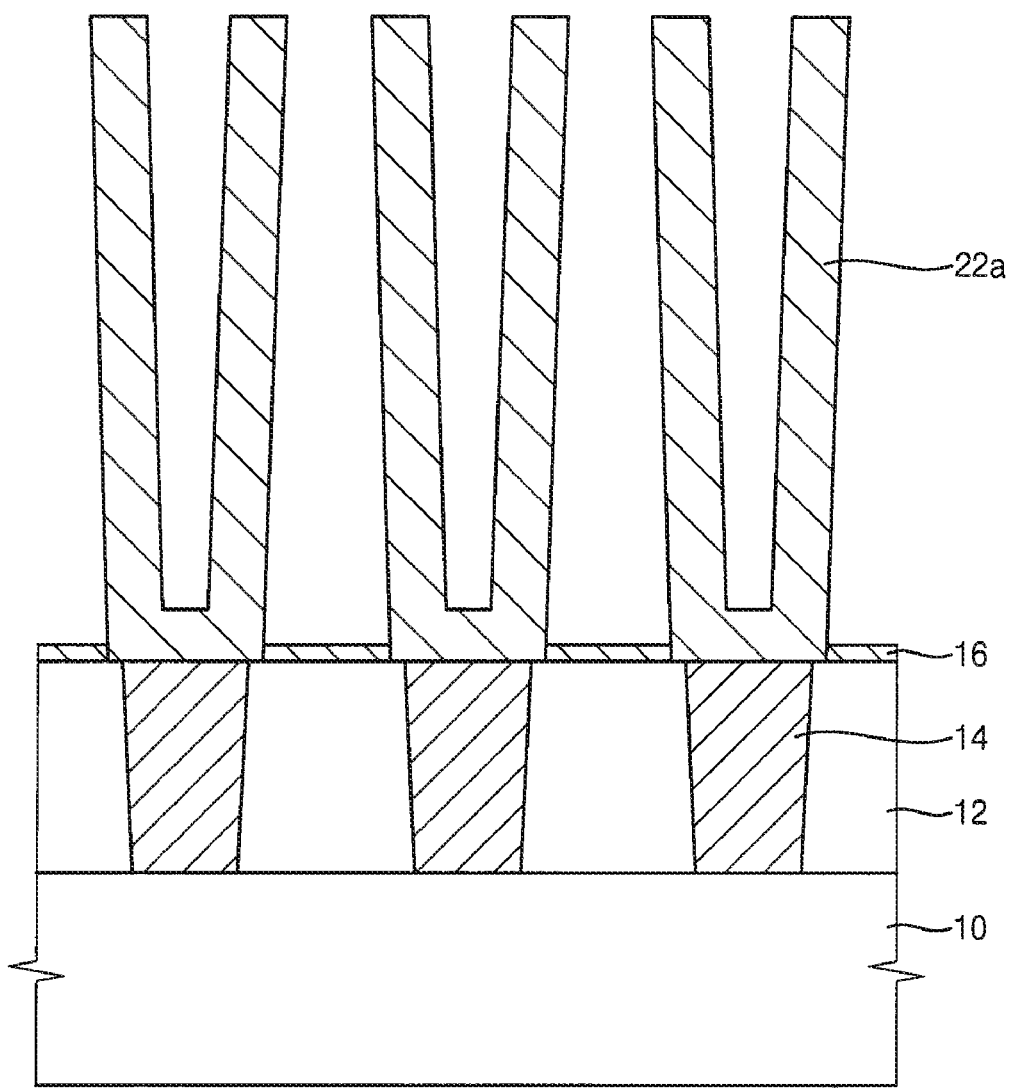

Referring to FIG. 3, a sacrificial layer (not shown) is formed on the lower electrode layer 22 to a sufficient thickness to fill up the first hole 20, and then the sacrificial layer and the lower electrode layer 22 are removed by a chemical mechanical polishing (CMP) process or an etch back process until the top surface of the mold oxide layer 18 is exposed, so that the sacrificial layer remains only in the first hole 20 surrounded by the lower electrode layer 22, thereby forming a cylindrical polysilicon pattern in the first hole 20. Then, the mold oxide layer 18 and the sacrificial layer in the first hole 20 are simultaneously removed, and inner and outer surfaces of the lower electrode layer 22 are exposed. A top surface of the etching stop layer 16 is also exposed by removing the mold oxide layer 18. Accordingly, the cylindrical polysilicon pattern is formed into a cylindrical lower electrode 22a of a capacitor by etch back node separation or CMP node separation.

Figure 4:
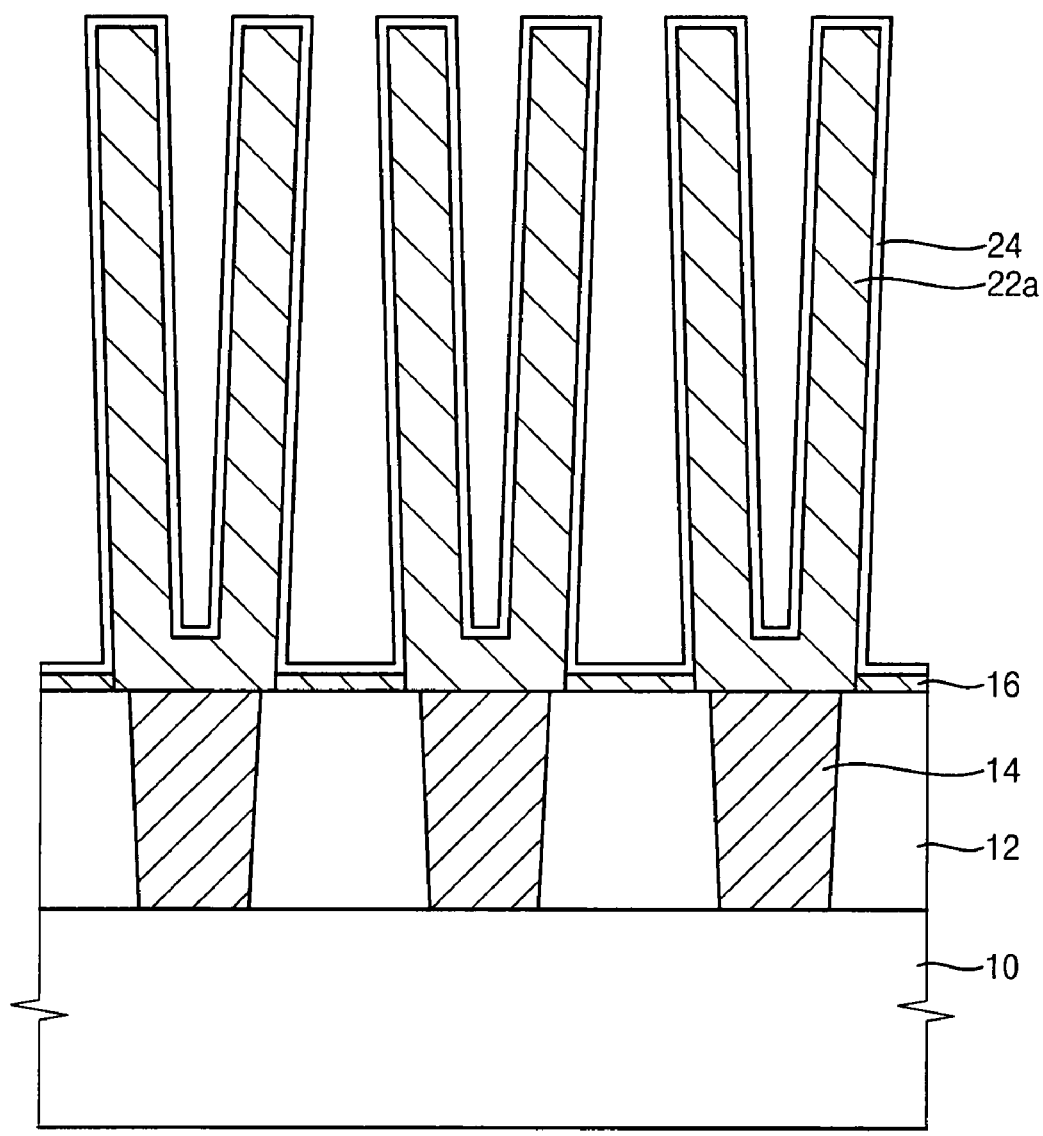

Referring to FIG. 4, a dielectric layer 24 is formed on inner, top and outer surfaces of the cylindrical lower electrode 22a and on the exposed surface of the etching stop layer 16, so that the dielectric layer 24 is formed along a profile of the cylindrical lower electrode 22a. In the illustrated embodiments, the dielectric layer 24 comprises a metal oxide having a high dielectric constant. The metal oxide has a high thermal stability and a high energy band gap. The dielectric layer 24 may consist of a single layer comprising hafnium oxide ($HfO_2$) or aluminum oxide ($Al_2O_3$), or the dielectric layer may be a multi-layer including a hafnium oxide ($HfO_2$) layer and an aluminum oxide ($Al_2O_3$) layer that are alternately stacked on each other. In the illustrated embodiments, a multi-layer including a hafnium oxide ($HfO_2$) layer and an aluminum oxide ($Al_2O_3$) layer is used as the dielectric layer 24.

Figure 5:
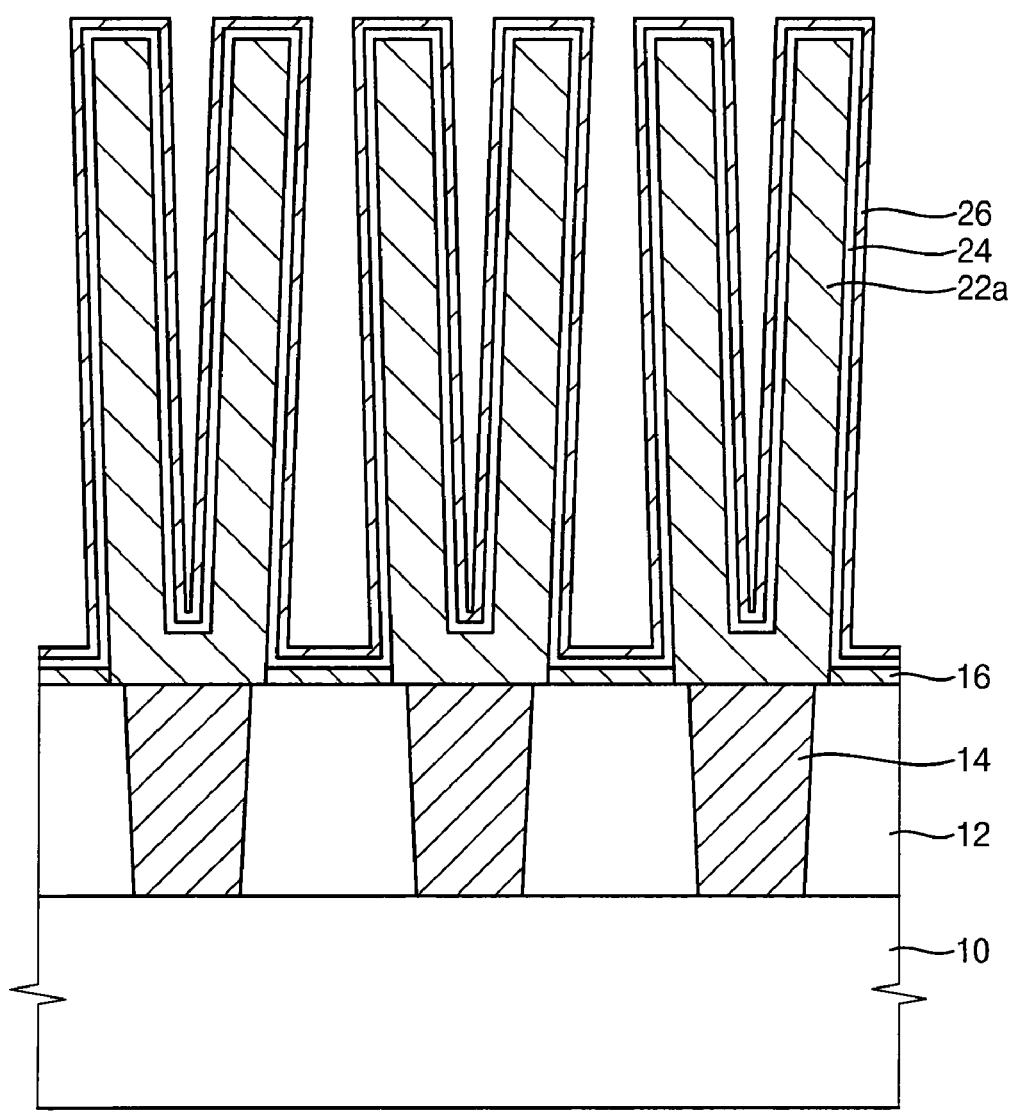

Referring to FIG. 5, a first titanium nitride layer is formed on a surface of the dielectric layer 24 along the profile of the lower electrode 22a by a cyclic CVD process, a CVD process or an ALD process, thereby forming a first sub-electrode 26 of the upper electrode 40 of the capacitor. A tensile stress exists in the first sub-electrode 26. An example of a cyclic CVD process includes an SFD process in which the processing gases are sequentially supplied into a processing chamber. An example of a CVD process includes a MOCVD process.

The first titanium nitride layer is formed to a thickness as small as possible under the condition that no cracking is generated therein, so that the first titanium nitride layer is formed to a thickness below about 150 Å. Preferably, the first titanium nitride layer is formed to a thickness of about 50 Å to about 110 Å.

In a process for forming the first titanium nitride layer, the partial pressure of titanium chloride ($TiCl_4$), which is a processing gas for forming the first titanium nitride layer, is maintained to be low as much as possible so as to minimize chemical reaction between the processing gas and the dielectric layer.

For the above reasons, the first titanium nitride layer is formed by the SFD process in which the processing gases are sequentially supplied to the chamber.

Hereinafter, the SFD process for forming the first nitride layer is schematically described with reference to FIG. 7.

Figure 7:
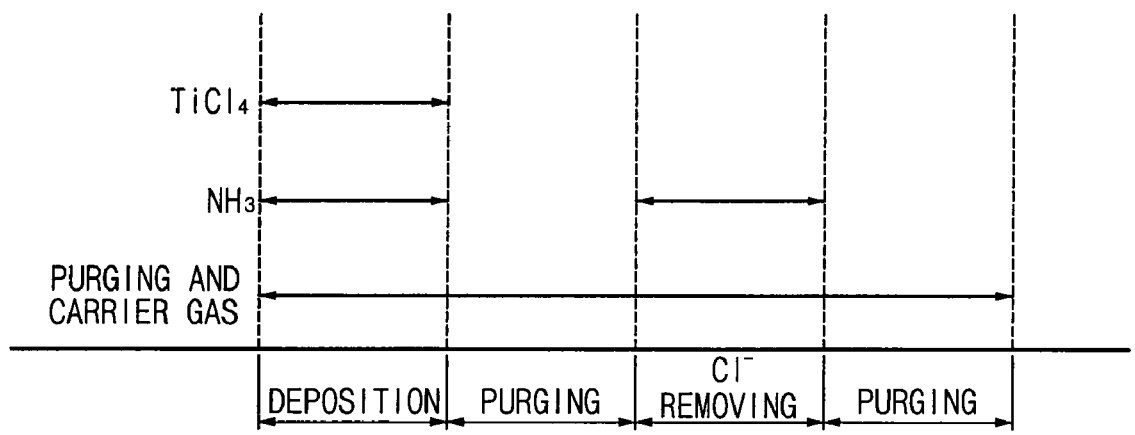
FIG. 7 is a timing diagram illustrating a gas inflow when a first titanium nitride layer is formed by a sequential flow deposition (SFD) process.

FIG. 7 is a timing diagram illustrating a gas inflow when the first titanium nitride layer is formed by the SFD process.

Referring to FIG. 7, during a deposition period, a mixture of titanium chloride ($TiCl_4$) gas and ammonia ($NH_3$) gas is supplied into a processing chamber as a processing gas for forming the first titanium nitride layer, and a first preliminary titanium nitride layer is formed on the dielectric layer to a first thickness. A carrier gas may be used for carrying each of the processing gases into the processing chamber. Examples of a carrier gas include argon gas, nitrogen gas, etc. These can be used alone or in combinations thereof. Internal pressure of the processing chamber is maintained in a range from about 2 torr to about 5 torr. A partial pressure of the titanium chloride ($TiCl_4$) in the mixture is maintained in a range from about 0.05 torr to about 0.2 torr, so that chemical reaction between chloride (Cl) and hafnium (Hf) is minimized.

Then, the supply of the processing gas is stopped, and a first purge gas is supplied into the processing chamber, thereby purging a residual gas of the processing gas and byproducts out of the processing chamber. Examples of the purge gas include argon gas, nitrogen gas, etc. These can be used alone or in combinations thereof.

An ammonia gas ($NH_3$) is supplied to the processing chamber, and residual chloride ions (Cl—) are removed from the processing chamber.

The supply of the ammonia ($NH_3$) gas is stopped, and a second purge gas is supplied into the processing chamber, thereby purging the residual ammonia gas from the processing chamber.

A sequential circulation of the deposition for the preliminary titanium nitride layer, the first purge, the supply of ammonia ($NH_3$) gas and the second purge completes one cycle for forming the first titanium nitride layer. A thickness of the first titanium nitride layer per one cycle (hereinafter referred to as unit thickness) is no more than about 50 Å. In the illustrated embodiments, the unit thickness of the first titanium nitride layer is about 10 Å. A thickness of the first titanium nitride layer is determined by a number of repetitions of the cycle.

Figure 6:
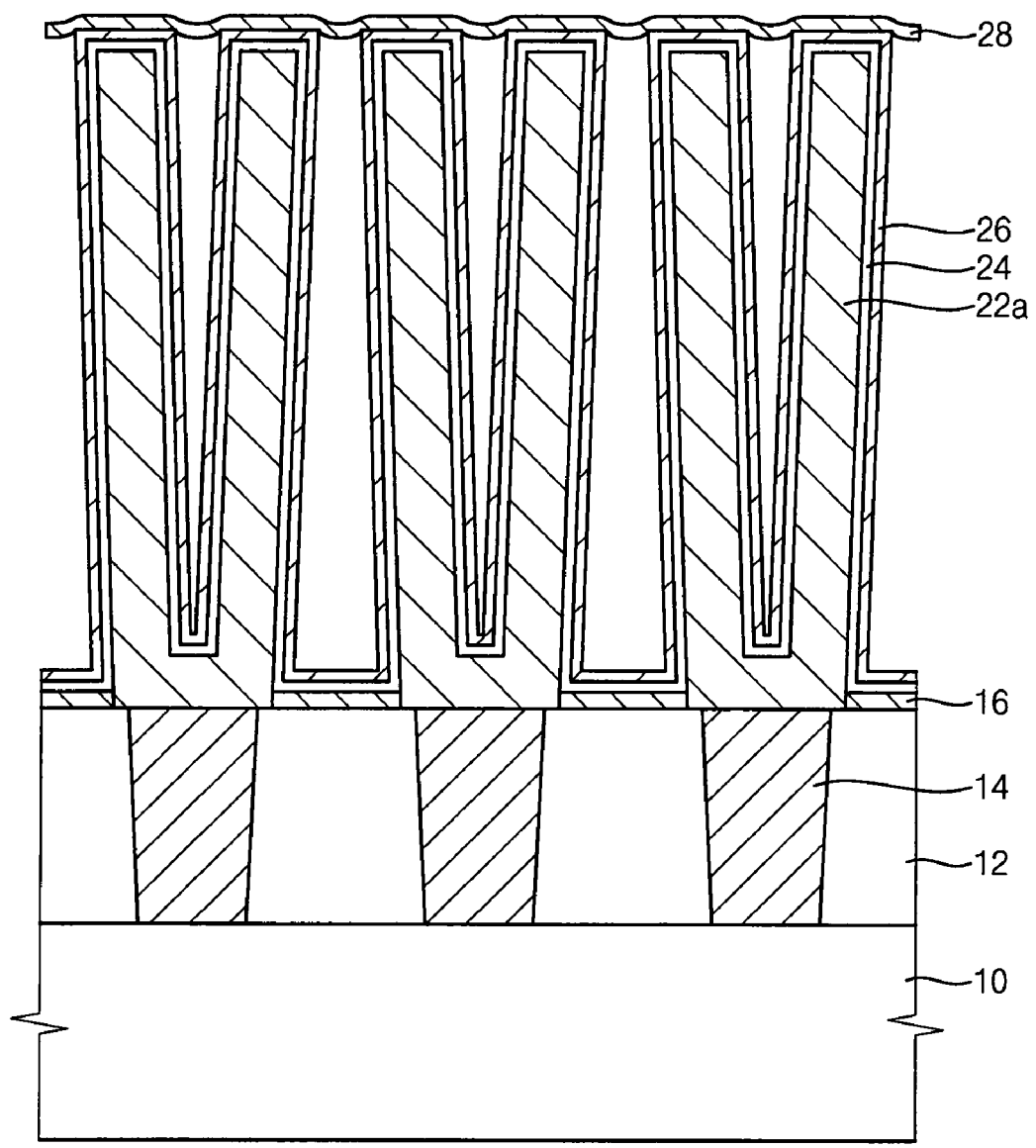

Referring to FIG. 6, a second titanium nitride layer is continuously formed on the first sub-electrode 26 corresponding to the top surface of the lower electrode 22a by a PVD process, for example, a sputtering process or a collimating process, thereby forming a second sub-electrode 28 of the upper electrode 40 of the capacitor. Accordingly, an opening portion of the cylindrical lower electrode 22a is covered with the second sub-electrode 28. A compression stress is applied in the second titanium nitride layer. When the thickness of the second titanium nitride layer is less than about 50 Å, there is a problem in that the opening portion of the lower electrode 22a is not sufficiently covered with the second titanium nitride layer, so that the second titanium nitride layer is formed to a thickness of at least about 50 Å. In the present embodiment, the first titanium nitride layer is preferably formed to a thickness of about 150 Å to about 250 Å.

The internal stresses in the first and second sub-electrodes 26 and 28 are in opposite directions from each other to thereby cancel each other in the upper electrode of a capacitor, so that cracking is minimized on the upper electrode.

A polysilicon layer is formed on the second sub-electrode 28 as shown in FIG. 1, thereby forming the third sub-electrode 30 of the upper electrode 40 of the capacitor.

Accordingly, the second sub-electrode 28 covers the opening portion of the lower electrode 22a, and the polysilicon layer does not make direct contact with the dielectric layer 24 in the first hole 20. As a result, when the third sub-electrode 30 of polysilicon is formed at a high temperature, a chemical reaction between the polysilicon layer and the dielectric layer 24 is minimized, and a dielectric constant of the dielectric layer 24 does not decrease.

Figure 8:
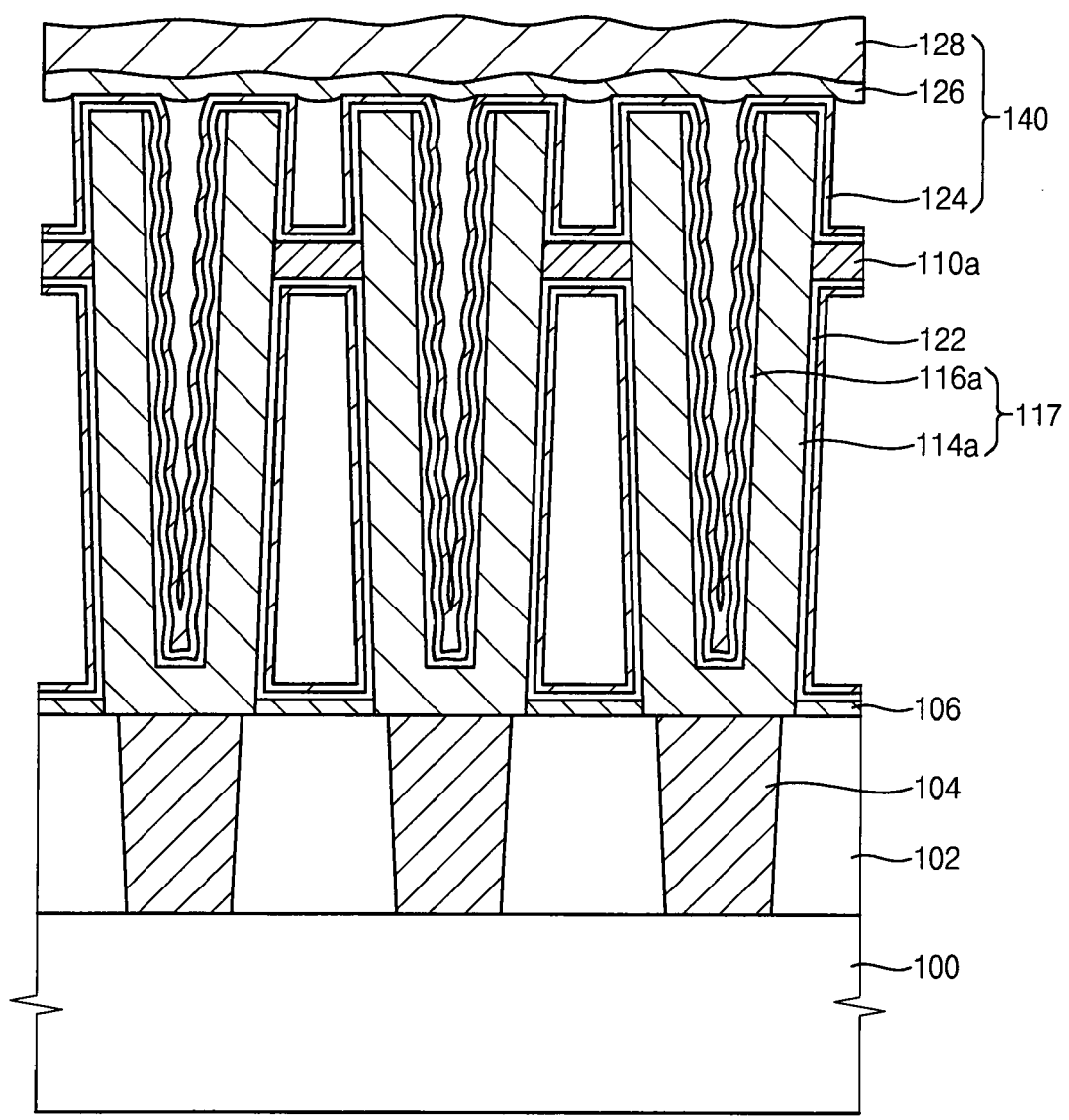
FIG. 8 is a sectional view illustrating a capacitor for a semiconductor device according to some other embodiments of the invention.

FIG. 8 is a sectional diagram illustrating a capacitor for a semiconductor device according to some other embodiments of the invention.

Referring to FIG. 8, an insulation interlayer 102 is formed on a substrate 100, and a contact plug 104 is formed through the insulation interlayer 102. A cylindrical lower electrode 117 for the capacitor makes contact with a top surface of the contact plug 104. In the illustrated embodiments, the lower electrode 117 includes a cylindrical polysilicon pattern 114a and a hemispherical grain pattern 116a formed on an inner surface of the cylindrical polysilicon pattern 114a, so that a surface area of the lower electrode 117 becomes larger due to a grain structure of the hemispherical grain pattern 116a.

Alternatively, the lower electrode 117 may include a cylindrical polysilicon pattern and a hemispherical grain pattern formed on inner, outer and top surfaces of the cylindrical polysilicon pattern. However, when the hemispherical grain (HSG) pattern 116a is formed on the outer surface of the cylindrical polysilicon pattern 114a, a dielectric layer and an upper electrode of the capacitor are unavoidably formed on an uneven grain structure of the hemispherical grain pattern 116a, and a short circuit may be undesirably caused between neighboring upper electrodes that are adjacent to each other. Accordingly, the HSG layer 116a may be formed only on the inner surface of the cylindrical polysilicon pattern 114a, especially for a highly integrated semiconductor device in which an interval between neighboring capacitors adjacent to each other is very small.

A ring-shaped support pattern 110a surrounds a portion of an outer surface of the cylindrical lower electrode 117, so that neighboring lower electrodes are connected with each other by the support pattern 110a like a mesh. Accordingly, the cylindrical lower electrode 117 is supported by the support pattern 110a, which prevents the lower electrode from slanting, bending, or breaking.

A dielectric layer 122 comprising a metal oxide of a high dielectric constant is formed on inner, top and outer surfaces of the cylindrical lower electrode 117, so that the dielectric layer 122 is formed along a profile of the cylindrical lower electrode 117. Examples of the dielectric layer 122 include an aluminum oxide layer, a hafnium oxide layer, and a multilayer of an aluminum oxide layer and a hafnium oxide layer alternately stacked on each other.

An upper electrode 140 including first, second and third sub-electrodes 124, 126 and 128 is formed on the dielectric layer 122.

In particular, the first sub-electrode 124 comprising a first titanium nitride is formed on a surface of the dielectric layer 122 along the profile of the lower electrode 117 to a thickness of about 50 Å to 110 Å, and a tensile stress is applied in the first sub-electrode 124.

The second sub-electrode 126 is continuously formed on the first sub-electrode 124 corresponding to the top surface of the lower electrode 117, so that an opening portion of the cylindrical lower electrode 117 is covered with the second sub-electrode 126. The second sub-electrode 126 comprises a second titanium nitride layer, and a compression stress is applied in the second sub-electrode 126. Accordingly, the tensile stress in the first sub-electrode 124 and the compression stress in the second sub-electrode 126 cancel each other in the upper electrode 140.

The third sub-electrode 128 comprising polysilicon is formed on the second sub-electrode 126.

In the above structure of the capacitor, the HSG pattern 116a is formed on the inner surface of the cylindrical lower electrode 117, so that capacitance of the capacitor of the present embodiment is improved. Further, the support pattern 110a prevents the lower electrode from being broken or slanted.

The lower electrode structure of the illustrated embodiments are more complicated due to the HSG pattern and the support pattern, which would normally result in more cracking in the upper electrode of the capacitor. However, much less internal stress is generated in the upper electrode due to opposite directions of stresses in the first and second sub-electrodes of the upper electrode, so the cracking is minimized.

FIGS. 9 to 13 are cross sectional diagrams illustrating a method of forming the capacitor shown of FIG. 8 in accordance with some other embodiments of the invention.

Figure 9:
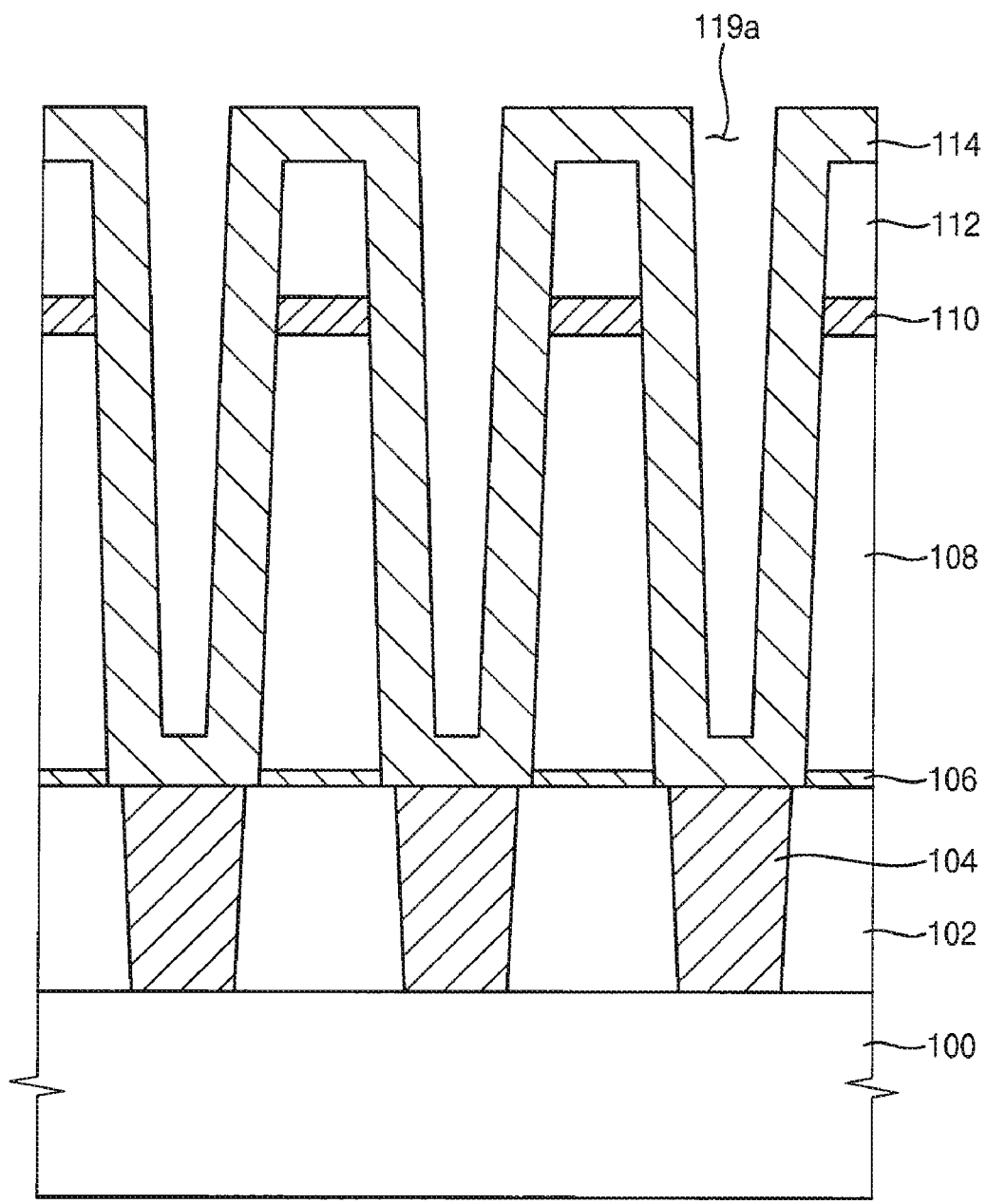
FIGS. 9 to 13 are sectional diagrams illustrating a method of forming the capacitor of FIG. 8 in accordance with some other embodiments of the invention.

Referring to FIG. 9, an insulation interlayer 102 is formed on the substrate 100 including the underlying structures and a contact plug 104 is formed through the insulation interlayer 102. In the illustrated embodiments, the contact plug 104 makes contact with a landing pad (not shown) for a lower electrode that is connected to source/drain regions of a transistor.

An etching stop layer 106 is formed on the insulation interlayer 102 through which the contact plug 104 is formed. For example, the etching stop layer 106 comprises a silicon nitride. A first mold oxide layer 108 for molding a lower electrode of the capacitor is formed on the etching stop layer 106. For example, the first mold oxide layer 108 comprises a silicon oxide. The first mold oxide layer 108 may be a single layer or a multi-layer including various layers of which etching rates are different from each other.

A support layer 110 is formed on the first mold oxide layer 108, and comprises an insulation material having etching selectivity with respect to the first mold oxide layer 108. In the present embodiment, the support layer 110 comprises a silicon nitride and is formed to a thickness of about 500 Å.

A second mold oxide layer 112 is formed on the support layer 110.

Then, the second mold oxide layer 112, the support layer 110, the first mold oxide layer 108 and the etching stop layer 106 are sequentially and partially etched away, thereby forming a cylindrical hole through which the top surface of the contact plug 104 is exposed.

A polysilicon layer 114 is formed on an inner surface of the cylindrical hole, the exposed surface of the contact plug 104 and on a top surface of the second mold oxide layer 112. Accordingly, a first recess 119a is formed in the cylindrical hole, and a width of the first recess 119a is smaller than that of the cylindrical hole. The polysilicon layer 114 is to be formed into a lower electrode of the capacitor in a subsequent process.

Figure 10:
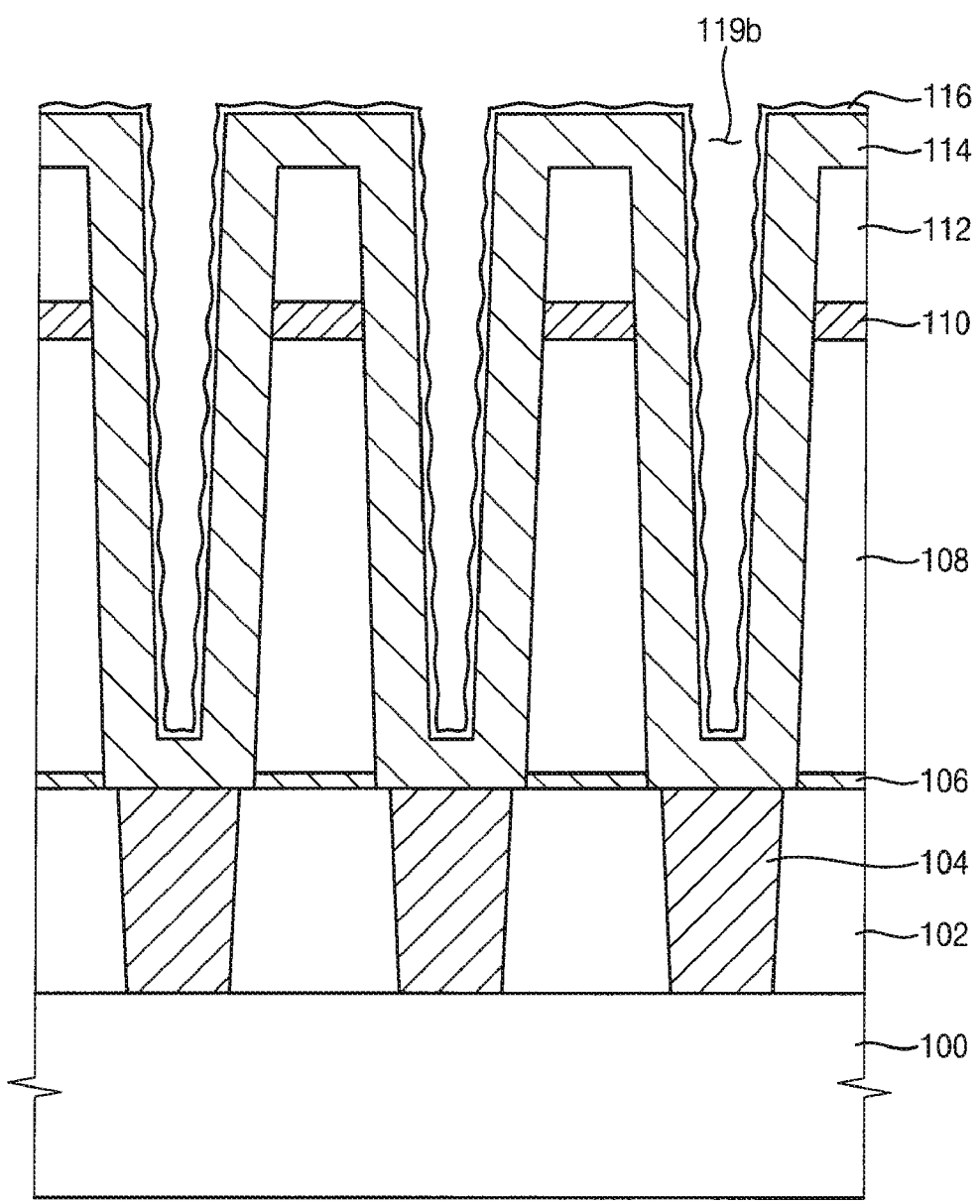

Referring to FIG. 10, silicon seeds are formed on an inner surface of the first recess 119a and a top surface of the polysilicon layer 114 using a silane ($SiH_4$) gas or a disilane ($Si_2H_6$) gas, and a heat treatment is performed on the silicon seeds, thereby forming an HSG layer 116 on the inner surface of the first recess 119a and on the polysilicon layer 114. Accordingly, a grain structure of the HSG layer 116 on the inner surface of the first recess 119a enlarges a surface area of the polysilicon layer 114 in the first recess 119a, thereby increasing capacitance of the capacitor when the polysilicon layer is formed into a lower electrode of the capacitor. A width of the first recess 119a is also reduced due to the HSG layer 116 on the inner surface thereof, and the reduced first recess 119a is referred to as second recess 119b hereinafter.

An outer surface of the polysilicon layer 114 opposite to the inner surface makes contact with the first and second mold oxide layers 108 and 112 and the support layer 110, so that the HSG layer is not formed on the outer surface of the polysilicon layer 114. Accordingly, no HSG pattern is formed on the outer surface of the polysilicon layer 114, and thus electric shorts between neighboring upper electrodes adjacent to each other may be minimized when the upper electrode is formed on the lower electrode.

Figure 11:
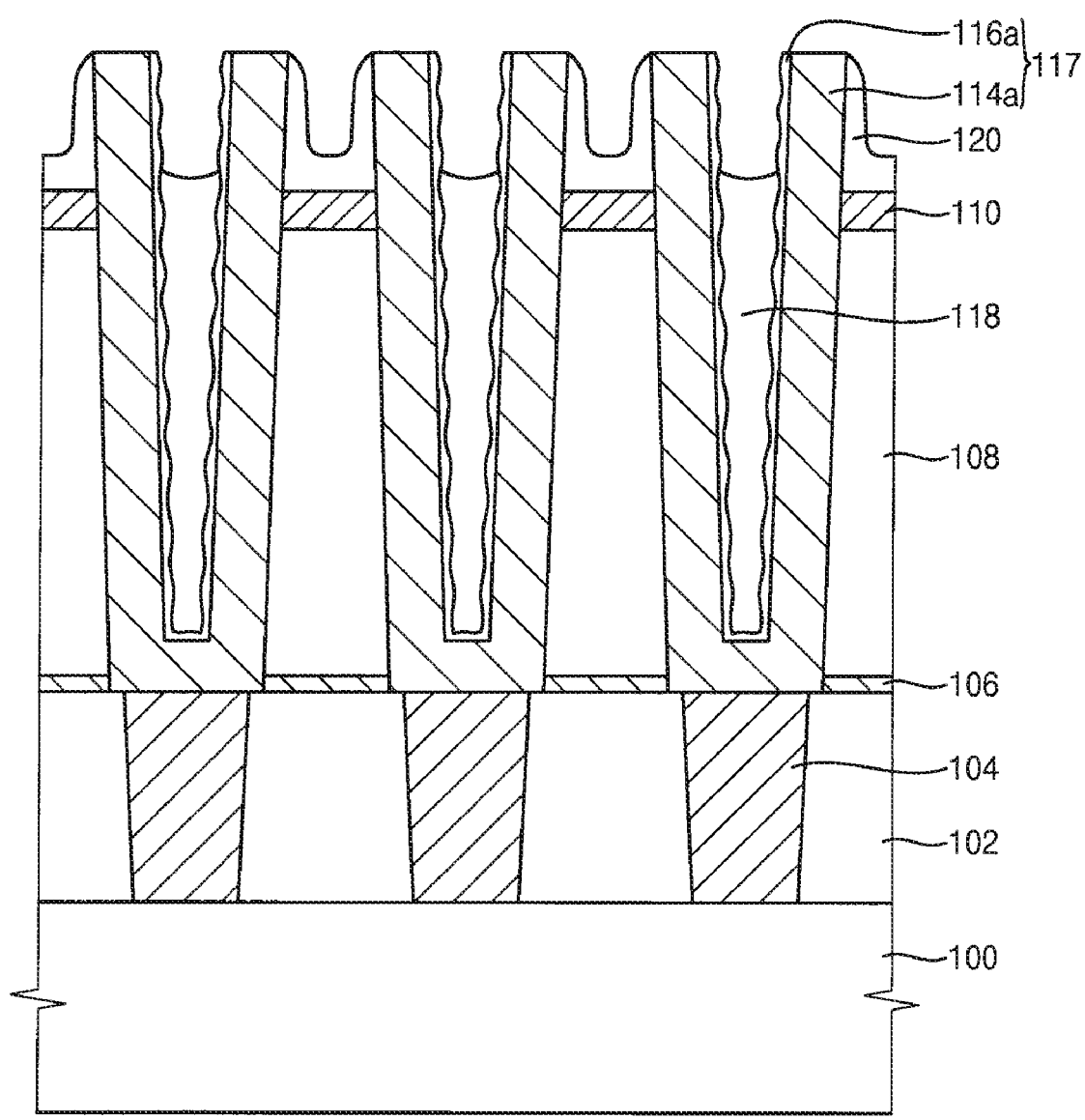

Referring to FIG. 11, a sacrificial layer (not shown) is formed on the HSG layer to a sufficient thickness to fill up the second recess 119b, and the sacrificial layer, the HSG layer 116 and the polysilicon layer 114 are removed by a CMP process or an etch back process until the top surface of the second mold oxide layer 112 is exposed, so that the sacrificial layer remains only in the second recess 119b. Accordingly, a cylindrical lower electrode 117 of the capacitor is formed by etch back node separation or CMP node separation. The cylindrical lower electrode 117 includes a polysilicon pattern 114a, and an HSG pattern 116a formed on a surface of the polysilicon pattern 114a.

Then, the second mold oxide layer 112 is removed until a top surface of the support layer 110 is exposed. A portion of the sacrificial layer is also removed simultaneously with the second mold oxide layer 112, so that a sacrificial pattern 118 is formed in the second recess 119b.

An insulation layer (not shown) is formed on the support layer 110 and the sacrificial pattern 118, so that a first gap portion in which the cylindrical lower electrodes 117 are relatively adjacent to each other is sufficiently filled with the insulation layer, and a second gas portion in which the cylindrical lower electrodes 117 are relatively spaced apart is insufficiently filled with the insulation layer. The insulation layer comprises a material having an etching selectivity with respect to the support layer 110 such as a silicon oxide. In the present embodiment, the insulation layer is formed by an AP-CVD process, so that voids are minimized in the first and second gap portions between the cylindrical lower electrodes 117.

The insulation layer is partially and anisotropically etched away, so that an insulation pattern 120 for forming a support pattern is formed on the support layer 110 and the sacrificial pattern 118. In the present embodiment, the insulation pattern 120 is formed on an outer surface of the cylindrical lower electrode 117 on which the HSG pattern is formed. The insulation layer in the first gap portion remains on the support layer 110 after completing the anisotropic etching process, so that the support layer 110 is not exposed through the insulation pattern 120, and the insulation layer in the second gap portion is almost removed by the etching process, so that the support layer 110 is exposed through the insulation pattern 120.

Figure 12:
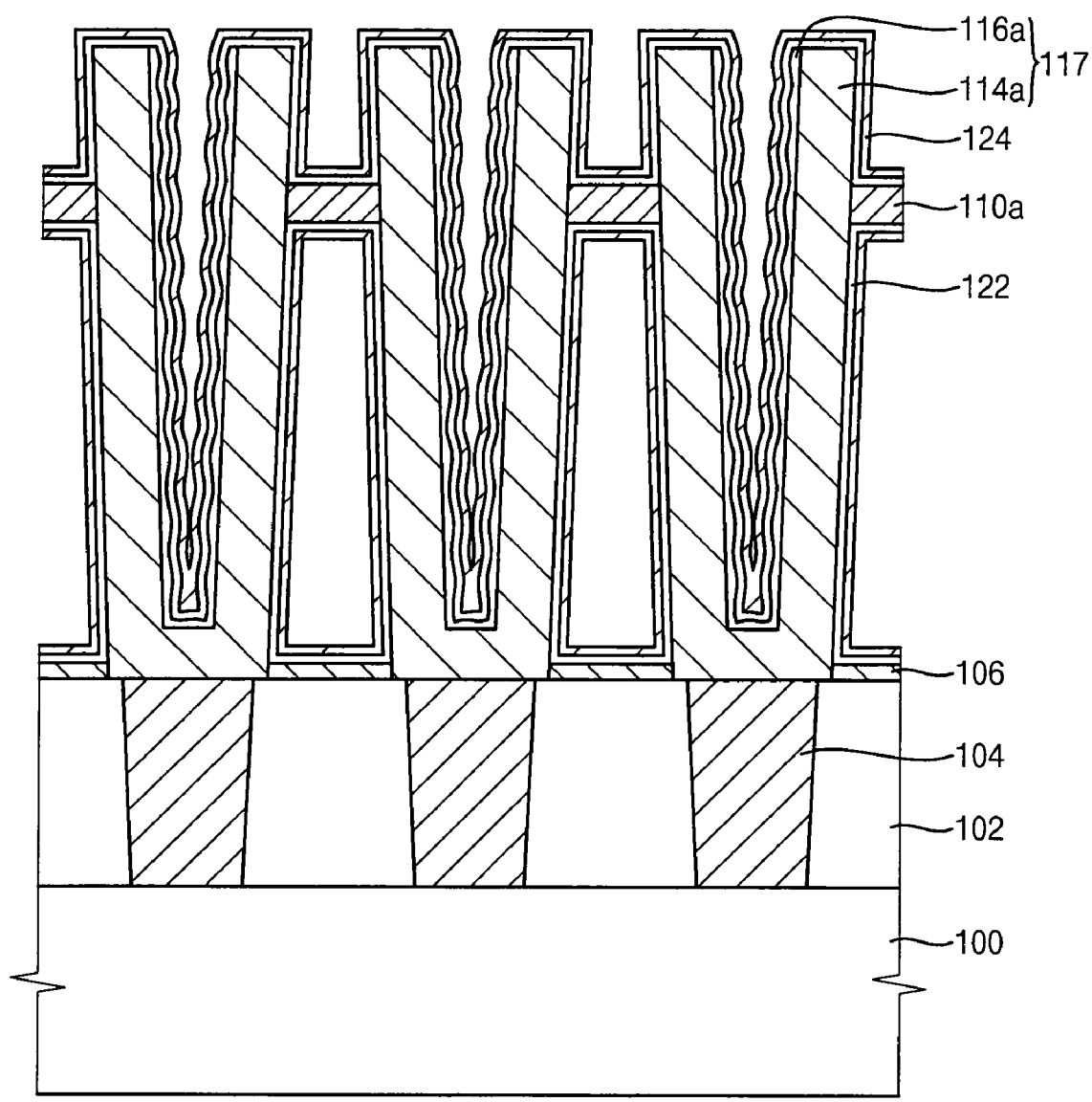

Referring to FIG. 12, the support layer 110 is partially etched away using the insulation pattern 120 as an etching mask, thereby forming a mesh-shaped support pattern 110a. The lower electrode 117 is prevented from being broken or slanted by the support pattern 110a. However, a contact portion of the support pattern 110a with which the lower electrodes 117 make simultaneous contact (hereinafter referred to as a wing portion) is substantially perpendicular to the lower electrode 117. Accordingly, much more stress is applied at a contact surface of the lower electrodes 117 with which the wing portion of the support pattern 110a makes contact when a dielectric layer or an upper electrode are formed in a subsequent process, so that cracking is more easily generated at the contact surface of the lower electrode 117.

Then, the insulation pattern 120, the first mold oxide layer 108 and the sacrificial pattern 118 are sequentially removed, so that top, inner and outer surfaces of the lower electrode 117 are exposed.

A dielectric layer 122 is formed on top, inner and outer surfaces of the lower electrode 117, so that the dielectric layer 122 is formed along a profile of the lower electrode. In the present embodiment, the dielectric layer 122 comprises a metal oxide of which a dielectric constant is high. For example, the dielectric layer 122 includes a single layer comprising hafnium oxide (HfO$_2$) or aluminum oxide (Al$_2$O$_3$), or a multi-layer including a hafnium oxide (HfO$_2$) layer and an aluminum oxide (Al$_2$O$_3$) layer alternately stacked on each other.

A first titanium nitride layer is formed on the dielectric layer 122 along the profile of the cylindrical lower electrode 117 by a cyclic CVD process, a CVD process or an ALD process, thereby forming a first sub-electrode 124 of an upper electrode of the capacitor, and a tensile stress is applied in the first titanium nitride layer. An example of the cyclic CVD process includes an SFD process in which the processing gases are sequentially supplied into a processing chamber. An example of the CVD process includes a MOCVD process.

The inner surface of the lower electrode 117 is very uneven because of the HSG pattern 116a, so that the first titanium nitride layer is hardly formed on the inner surface of the lower electrode 117 without any cracking therein. Further, the wing portion of the support pattern 110a is substantially perpendicular to the contact surface of the lower electrode 117, so that the first titanium nitride layer is also hardly formed on the wing portion of the support pattern 110a. Accordingly, the first titanium nitride layer is formed to a thickness sufficiently small to prevent the cracking. For example, the first titanium nitride layer is formed to a thickness no less than about 150 Å. In the present embodiment, the first titanium nitride layer is formed to a thickness of about 50 Å to about 110 Å.

The process for forming the first titanium nitride layer is the same as in Embodiment 1, so any further detailed descriptions on the process for forming the first titanium nitride layer will be omitted.

Figure 13:
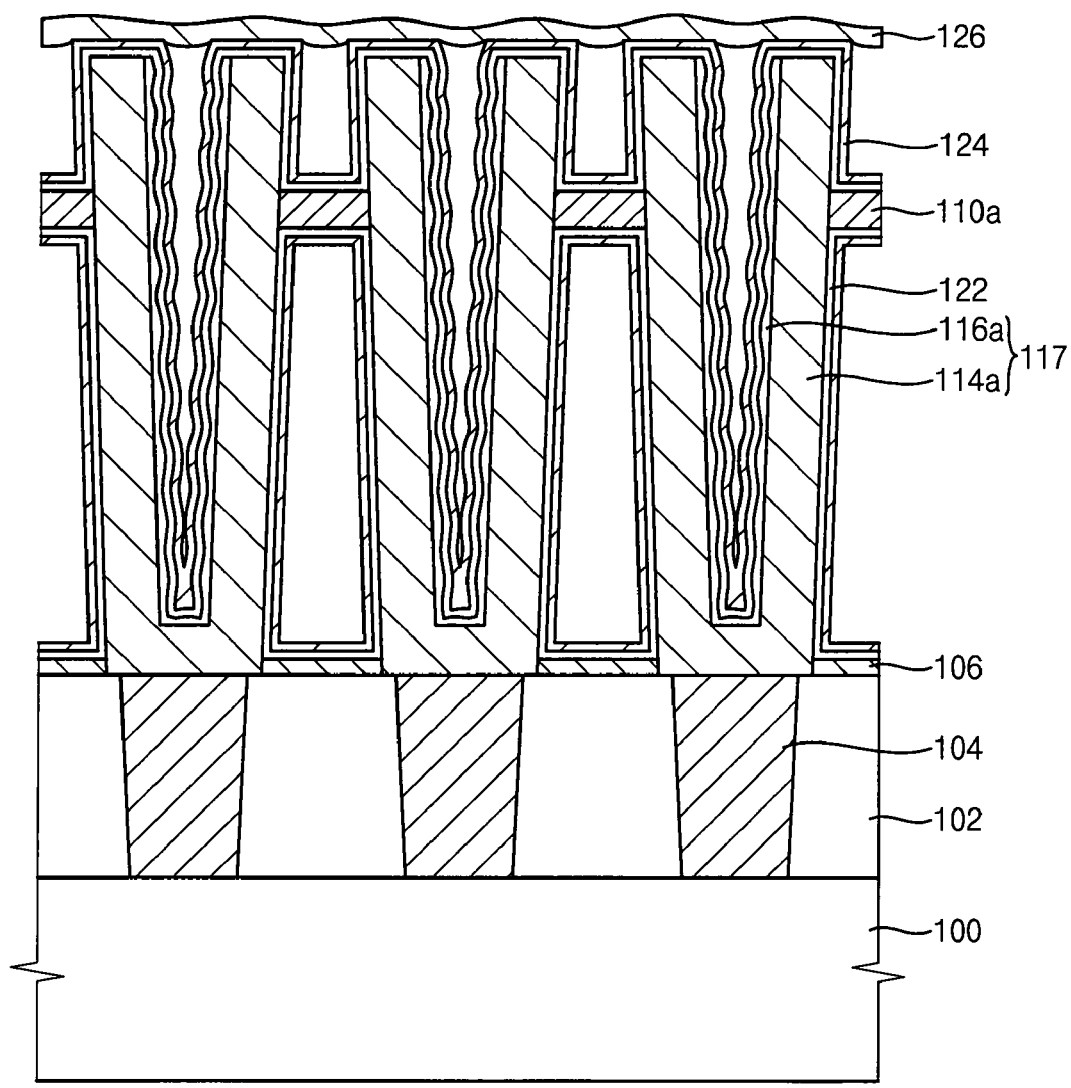

Referring to FIG. 13, a second titanium nitride layer is continuously formed on the first sub-electrode 124 corresponding to the top surface of the lower electrode 117 by a PVD process, for example, a sputtering process or a collimating process, thereby forming a second sub-electrode 126 of the upper electrode 40 of the capacitor. Accordingly, an opening portion of the cylindrical lower electrode 117 is covered with the second sub-electrode 126. A compression stress is applied in the second titanium nitride layer. The second titanium nitride layer is formed to a thickness of at least about 50 Å. In the present embodiment, the first titanium nitride layer is formed to a thickness of about 150 Å to about 250 Å.

The internal stresses in the first and second sub-electrodes 124 and 126 are in opposite directions from each other to thereby cancel each other in the upper electrode of the capacitor, so that cracking is minimized on the upper electrode.

As shown in FIG. 8, a polysilicon layer is formed on the second sub-electrode 126, thereby forming the third sub-electrode 128 of the upper electrode of the capacitor.

Accordingly, the second sub-electrode 126 covers the opening portion of the cylindrical lower electrode 117, so that the polysilicon layer does not make direct contact with the dielectric layer 122 on the surface of the lower electrode 117. As a result, when the third sub-electrode 128 of polysilicon is formed at a high temperature, a chemical reaction between the polysilicon layer and the dielectric layer 122 is minimized, and a dielectric constant of the dielectric layer 122 does not decrease.

According to the present invention, cracking is minimized in an upper electrode of the capacitor, and a dielectric constant of a dielectric layer sufficiently increases. As a result, device characteristics and reliability of a semiconductor device are remarkably improved.

The invention may be practiced in many ways. What follows are exemplary, non-limiting descriptions of some embodiments of the invention.

According to an embodiment of the present invention, there is provided a capacitor comprising a cylindrical lower electrode, a dielectric layer and an upper electrode having first and second sub-electrodes of which internal stresses are opposite to each other. The dielectric layer comprises a metal oxide and is formed on inner, top and outer surfaces of the cylindrical lower electrode, so that the dielectric layer is formed along a profile of the lower electrode. The first sub-electrode is formed on a surface of the dielectric layer along the profile of the lower electrode and the second sub-electrode is continuously formed on a surface of the first sub-electrode corresponding to the top surface of the lower electrode, so that an opening portion of the cylindrical lower electrode is covered with the second sub-electrode. The first sub-electrode includes a first metal nitride layer in which a first stress is applied, and the second sub-electrode includes a second metal nitride layer in which a second stress, of which a direction is opposite to that of the first stress, is applied.

According to another embodiment of the present invention, there is provided a method of forming the above capacitor for a semiconductor device. A lower electrode is formed into a cylindrical shape. A dielectric layer comprising a metal oxide is formed on inner, top and outer surfaces of the cylindrical lower electrode, so that the dielectric layer is formed along a profile of the lower electrode. An upper electrode is formed to have first and second sub-electrodes of which internal stresses are opposite to each other. The first sub-electrode is formed on a surface of the dielectric layer along the profile of the lower electrode and the second sub-electrode is continuously formed on a surface of the first sub-electrode corresponding to the top surface of the lower electrode, so that an opening portion of the cylindrical lower electrode is covered with the second sub-electrode. The first sub-electrode includes a first metal nitride layer in which a first stress is applied, and the second sub-electrode includes a second metal nitride layer in which a second stress, of which a direction is opposite to that of the first stress, is applied.

According to the present invention, the internal stresses in the upper electrode cancel each other, so that cracking is minimized in the upper electrode of the capacitor, thereby improving a current leakage characteristic of the capacitor.

Further, because the second sub-electrode covers the opening portion of the cylindrical lower electrode, a thin layer formed on the second sub-electrode does not make direct contact with the dielectric layer on the surface of the lower electrode. As a result, a chemical reaction between the thin layer and the dielectric layer is minimized, and a dielectric constant of the dielectric layer does not decrease.

Although exemplary embodiments have been described, it is understood that the invention is not limited to these exemplary embodiments because various changes and modifications can be made by one skilled in the art without departing from the spirit and scope of the invention as defined in the attached claims.

The invention claimed is:

1. A capacitor for a semiconductor device, the capacitor comprising:
   a lower electrode having a cylindrical shape;
   a dielectric layer that includes a metal oxide, the dielectric layer disposed on an inner surface, a top surface, and an outer surface of the lower electrode, the dielectric layer formed along a profile of the lower electrode; and
   an upper electrode including a first sub-electrode and a second sub-electrode, the first sub-electrode disposed on a surface of the dielectric layer along the profile of the lower electrode, the first sub-electrode including a first metal nitride layer in which a first stress is applied, the second sub-electrode disposed on a surface of the first sub-electrode that corresponds to a top surface of the lower electrode, the second sub-electrode including a second metal nitride layer in which a second stress is applied, the second stress in a direction opposite to a direction of the first stress.

2. The capacitor of claim 1, the dielectric layer selected from the group consisting of an aluminum oxide layer, a hafnium oxide layer, and a multi-layer having an aluminum oxide layer and a hafnium oxide layer alternately stacked on each other.

3. The capacitor of claim 1, the first stress consisting of a tensile stress, the second stress consisting of a compression stress, the tensile stress and the compression stress configured to cancel each other.

4. The capacitor of claim 1, the lower electrode comprising polysilicon.

5. The capacitor of claim 1, the lower electrode comprising a hemisphere grain layer, the hemisphere grain layer forming the inner surface of the lower electrode.

6. The capacitor of claim 1, further comprising a support pattern disposed in contact with the outer surface of the lower electrode and disposed in contact with an outer surface of another lower electrode disposed adjacent to the lower electrode.

7. The capacitor of claim 1, a thickness of the first sub-electrode ranging from about 50 Å to about 110 Å.

8. The capacitor of claim 1, the upper electrode further comprising a third sub-electrode that is disposed on the second sub-electrode, the third sub-electrode including polysilicon.

* * * * *